(12) United States Patent
Kim et al.

(10) Patent No.: US 9,812,213 B2
(45) Date of Patent: Nov. 7, 2017

(54) FLASH MEMORY, FLASH MEMORY SYSTEM AND OPERATING METHOD OF THE SAME

(71) Applicant: SAMSUNG ELECTRONICS CO., LTD., Suwon-si, Gyeonggi-do (KR)

(72) Inventors: Kyung-Ryun Kim, Daejeon (KR); Sang-Yong Yoon, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/098,791

(22) Filed: Apr. 14, 2016

(65) Prior Publication Data

US 2016/0225458 A1    Aug. 4, 2016

Related U.S. Application Data

(63) Continuation of application No. 14/150,320, filed on Jan. 8, 2014, now Pat. No. 9,330,775.

(30) Foreign Application Priority Data

Jan. 14, 2013    (KR) .................. 10-2013-0004037

(51) Int. Cl.
*G11C 16/28*    (2006.01)
*G11C 11/56*    (2006.01)
*G11C 16/04*    (2006.01)

(52) U.S. Cl.
CPC .......... *G11C 16/28* (2013.01); *G11C 11/5642* (2013.01); *G11C 16/0483* (2013.01)

(58) Field of Classification Search
CPC .......... H01L 21/0203; H01L 21/02381; H01L 21/02422; H01L 21/0245; H01L 21/02532;
(Continued)

(56) References Cited

U.S. PATENT DOCUMENTS 7,889,563 B2    2/2011    Cho et al.
8,072,805 B2    12/2011   Chou et al.
(Continued)

FOREIGN PATENT DOCUMENTS

JP    63-061498    3/1988
KR    1020090117172    11/2009
(Continued)

*Primary Examiner* — James G Norman
(74) *Attorney, Agent, or Firm* — F. Chau & Associates, LLC

(57) ABSTRACT

A flash memory, a flash memory system, and an operating method thereof. The method of operating a flash memory includes counting the number of memory cells having threshold voltages included in a first adjacent threshold voltage range (defined by a first reference read voltage for distinguishing between initially separated adjacently located threshold voltage distributions and a first search read voltage having a first voltage difference from the first reference read voltage), and a second adjacent threshold voltage range (defined by the first reference read voltage and a second search read voltage having a second voltage difference from the first reference read voltage), and setting a first optimal read voltage based on the difference between the first and second counted numbers of the memory cells.

19 Claims, 17 Drawing Sheets

(58) Field of Classification Search
CPC ........... H01L 21/0262; H01L 21/02631; H01L 21/2007; H01L 21/76245; H01L 21/76251; H01L 21/76256; G11C 11/5642; G11C 16/0483
USPC .................................................. 365/185.03
See application file for complete search history.

(56) References Cited

U.S. PATENT DOCUMENTS

| | | | |
|---|---|---|---|
| 8,125,827 B2 | 2/2012 | Park | |
| 8,694,854 B1 * | 4/2014 | Dar | G11C 11/5642 714/752 |
| 9,330,775 B2 * | 5/2016 | Kim | G11C 16/28 |
| 2009/0003058 A1 | 1/2009 | Kang | |
| 2010/0091535 A1 | 4/2010 | Sommer et al. | |
| 2010/0296350 A1 | 11/2010 | Kim et al. | |
| 2010/0302850 A1 | 12/2010 | Kim et al. | |
| 2011/0038205 A1 | 2/2011 | Chou et al. | |
| 2013/0194883 A1 * | 8/2013 | Lee | G11C 29/04 365/201 |
| 2014/0101519 A1 * | 4/2014 | Lee | G06F 11/1068 714/773 |
| 2014/0198567 A1 * | 7/2014 | Mokhlesi | G11C 11/5642 365/185.03 |
| 2014/0198569 A1 * | 7/2014 | Kim | G11C 16/28 365/185.03 |
| 2014/0201580 A1 * | 7/2014 | Desireddi | G06F 12/0246 714/721 |
| 2015/0205664 A1 * | 7/2015 | Janik | G06F 11/1012 714/764 |

FOREIGN PATENT DOCUMENTS

| | | |
|---|---|---|
| KR | 1020090129205 | 12/2009 |
| KR | 1020100010746 | 2/2010 |
| WO | 2008/156238 | 12/2008 |

* cited by examiner

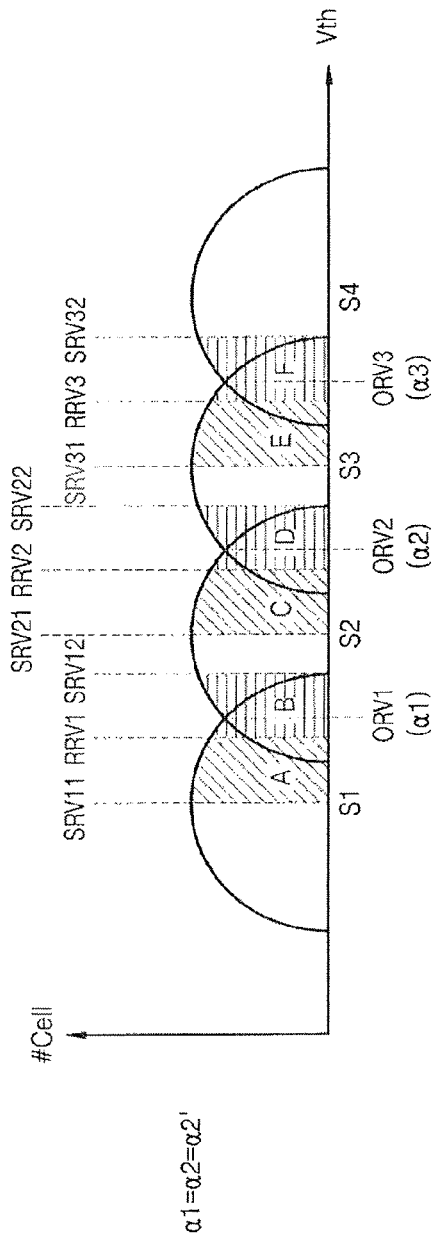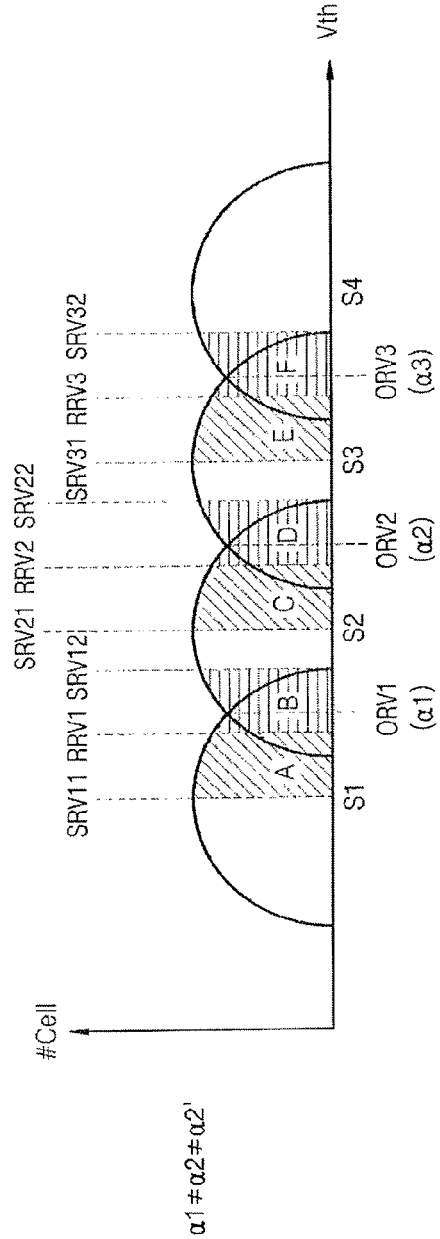

FIG. 13

TABLE

| #P/E cycle | α1 |
|---|---|
| Per1 | X |
| Per2 | Y |
| ⋮ | ⋮ |
| Perm | Z |

FLASH MEMORY, FLASH MEMORY SYSTEM AND OPERATING METHOD OF THE SAME

CROSS-REFERENCE TO RELATED APPLICATION

This application is a continuation of U.S. application Ser. No. 14/150,320 filed on Jan. 8, 2014 which claims priority under 35 U.S.C. 119 to Korean Patent Application No. 10-2013-0004037 filed on Jan. 14, 2013, in the Korean Intellectual Property Office, the disclosure of which is incorporated by reference herein in its entirety.

TECHNICAL FIELD

The inventive concept relates to a flash memory, a flash memory system and an operating method thereof, and more particularly, to a flash memory, a flash memory system, and an operating method thereof.

DISCUSSION OF THE RELATED ART

As the integration density of a flash memory increases, operation speed may increase, but read operation errors may also increase due to the effects on threshold voltage distributions of changes in the operating environment.

SUMMARY

According to an aspect of the inventive concept, there is provided a method of operating a flash memory, including: respectively counting the number of memory cells having threshold voltages included in a first co-adjacent threshold voltage range and a second co-adjacent threshold voltage range, existing because two initially-separated threshold voltage distributions have become overlapped, such that one of the first and second adjacent threshold voltage ranges includes a portion of the range of the first threshold voltage distribution and a portion of the range of the second threshold voltage distribution.

The first adjacent threshold voltage range is defined by a first reference read voltage (initially selected for distinguishing between adjacently located initially-separated threshold voltage distributions) and a first search read voltage having a first voltage difference from the first reference read voltage. The second adjacent threshold voltage range is defined by the first reference read voltage and a second search read voltage having a second voltage difference from the first reference read voltage. The method may further include setting a first optimal read voltage based on a result value generated from applying a first adjustment parameter to the difference between the number of the memory cells having the threshold voltages included the first adjacent threshold voltage range and the second adjacent threshold voltage range.

According to an aspect of the inventive concept, there is provided a method of operating a multi-level cell NAND flash memory, the method comprising: respectively counting the number of memory cells having threshold voltages included in a first threshold voltage range and a second voltage range defined by a first reference read voltage and a pair of first search read voltages having a first voltage difference and a second voltage difference from the a first reference read voltage, respectively; and setting a first optimal read voltage based on a result value generated by applying an adjustment parameter to the difference between the number of memory cells having threshold voltages within the first threshold voltage range and the number of memory cells having threshold voltages within the second threshold voltage range.

According to an aspect of the inventive concept, there is provided a method of operating a multi-level cell NAND flash memory system, the method comprising: counting the number of memory cells having threshold voltages included in a first adjacent threshold voltage range defined by a first reference read voltage and one of a pair of first search read voltages having a first voltage difference and a second voltage difference from the first reference read voltages, respectively; counting the number of memory cells having threshold voltages included in a second adjacent threshold voltage range defined by the first reference read voltage and the other one of the pair of first search read voltages; and setting a first optimal read voltage based on a result value generated by applying an adjustment parameter to the difference between the number of memory cells having threshold voltages respectively included within the first adjacent threshold voltage ranges and the number of memory cells having threshold voltages respectively included within the second adjacent threshold voltage range.

According to an aspect of the inventive concept, there is provided a flash memory system having a memory controller and a flash memory, comprising: a counter configured to count the number of memory cells included in each of a first adjacent threshold voltage range and a second adjacent threshold voltage range, defined by a first reference read voltage and by a pair of first search read voltages respectively having a first voltage difference and a second voltage difference from the first reference read voltage; and a control logic configured to set a first optimal read voltage based on a result value generated by applying a first adjustment parameter to the difference between the number of memory cells having threshold voltages included within the first adjacent threshold voltage range and the number of memory cells having threshold voltages included within the second threshold voltage range.

As used herein, the term "and/or" includes any and all combinations of one or more of the associated listed items. Expressions such as "at least one of," when preceding a list of elements, modify the entire list of elements and do not modify the individual elements of the list.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses or width of regions may be exaggerated for clarity. Like reference numerals in the drawings denote like elements, and thus redundant descriptions will be omitted.

The terms used in the present specification are used only to explain the exemplary embodiments, and do not limit the scope of the present invention. A singular expression may also include a plurality of expressions unless clearly stated otherwise in the context.

BRIEF DESCRIPTION OF THE DRAWINGS

Exemplary embodiments of the inventive concept will be more clearly understood from the following detailed description taken in conjunction with the accompanying drawings in which:

FIGS. 10A and 10B are threshold voltage distribution diagrams illustrating a relation between respective adjustment parameters of FIG. 9;

FIG. 13 is a table illustrating a method of operating a flash memory, according to an exemplary embodiment;

DETAILED DESCRIPTION OF THE EXEMPLARY EMBODIMENTS

Figure 1:
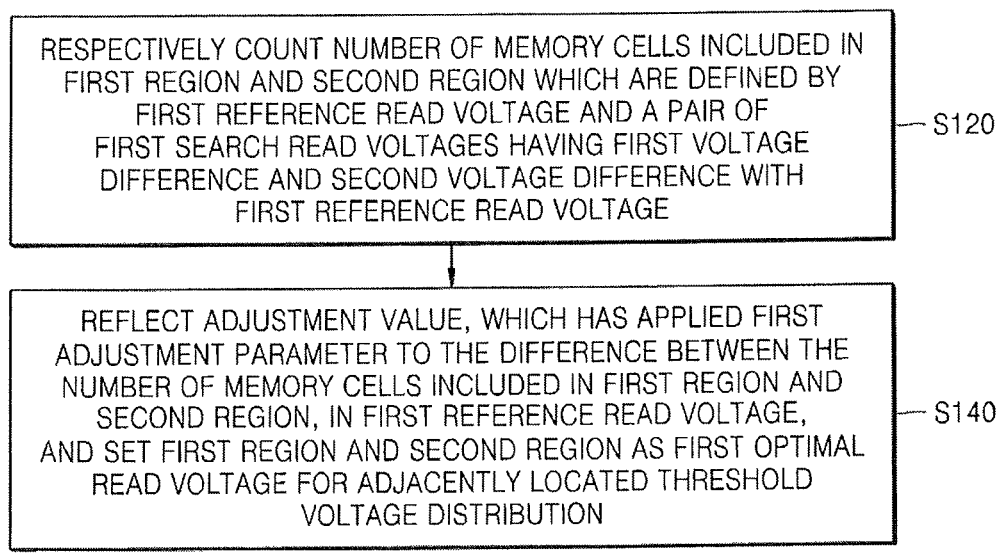
FIG. 1 is a flowchart illustrating a method of operating a flash memory, according to an embodiment.

FIG. 1 is a flowchart illustrating a method of operating a flash memory, according to an embodiment of the inventive concept.

Referring to FIG. 1, the method of operating a flash memory, according to an embodiment, includes a step (S120) of counting the number of memory cells included in a first threshold voltage range and counting the number of memory cells included in a second threshold voltage range, which are co-adjacent threshold voltage ranges that are different from the original ranges of the two corresponding threshold voltage distributions. The first (adjacent) threshold voltage range is defined by a first reference read voltage and by one of a pair of first and second search read voltages having first voltage and second voltage differences from respect to the first reference read voltage. The second (adjacent) threshold voltage range is defined by the first reference read voltage and by the other one of the pair of first and second search read voltages. The method of operating a flash memory further includes a step (S140) of setting a value, which is generated by applying the result value of calculating a first adjustment parameter based on the difference of the number of memory cells included in the first threshold voltage range and the number of memory cells included in the second threshold voltage range, as the first optimal read voltage for distinguishing between memory cells having threshold voltages in the adjacently located (and now overlapping) threshold voltage distributions and included the first adjacent threshold voltage range and the second adjacent threshold voltage range.

If a program operation is performed in a flash memory according to an exemplary embodiment, each memory cell comes to have certain state information. The state information represents an arbitrary (random) bit or arbitrary (random) data, and the threshold voltage distribution corresponding to each state is formed initially separated from the other(s). After the program operation is performed, a read operation is performed to identify the state of the memory cell. However, as the environment of the flash memory changes, a change of each threshold voltage distribution may be caused, and read errors may occur that cause the read state of the memory cell to be different from the originally programmed state. For example, read errors may be caused by a temperature change and by an increase in the program/erase (P/E) cycle count. Such a read error phenomenon may further be caused by an increase of the integration density of the flash memory circuit and by an increase of a number of the different states that are programmed in each memory cell.

The read errors may affect the reliability of a flash memory and of a memory system including the flash memory, and thus various schemes are being developed and applied to detected and correct the read errors. For example, error check and correction (ECC), read retry, soft decision, etc. may be applied to a flash memory.

An aspect of the method of operating the flash memory of FIG. 1 can reduce the time and resources used to correct errors by presenting a method of quickly predicting or detecting the voltage level of the optimal read voltage for minimizing the probability of error occurrence, as described in detail below.

Figure 2:
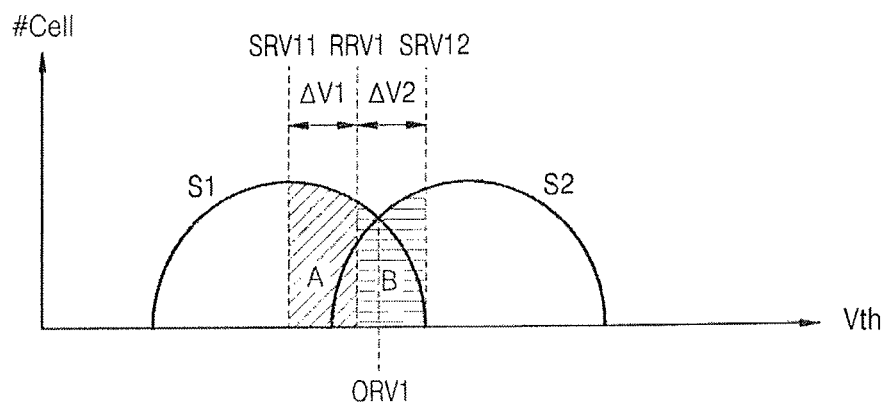
FIG. 2 is a threshold voltage distribution diagram illustrating a first threshold voltage range and a second threshold voltage range of FIG. 1.

FIG. 2 is a threshold voltage distribution diagram illustrating a first threshold voltage range and a second threshold voltage range representing two states of the flash memory cells in the flash memory operated by the method of FIG. 1.

Figure 3:
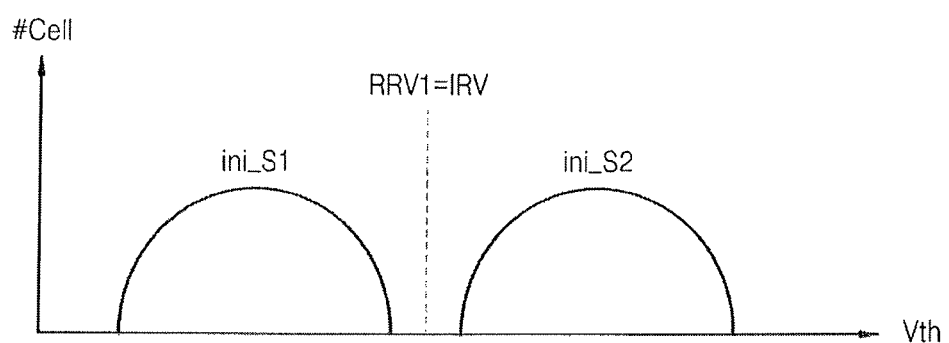
FIG. 3 is a threshold voltage distribution diagram illustrating a first reference read voltage of FIG. 1.

Referring to FIGS. 1 and 2, threshold voltage distributions S1 and S2 are adjacent to each other. As illustrated in FIG. 3, the first reference read voltage RRV1 is an initial read voltage IRV chosen for identifying initial states ini_S1 and ini_S2 of the adjacent threshold voltage distributions. The first reference read voltage RRV1 is be the read voltage that is set to identify the initial setting state of the first threshold voltage range A and the second threshold voltage range B before the environment of the flash memory changes. In order to reduce the probability of read error occurrence, it may be necessary to perform the read operation using a read voltage different from the first reference read voltage RRV1 such the voltage level at the point ORV1 where the threshold voltage distribution S1 crosses (intersects) the threshold voltage distribution S2. The read voltage having the voltage level at the point ORV1 where the threshold voltage distribution S1 crosses (the intersecting curves at such point indicate that the probability of memory cells of either state being at the point's threshold voltage is equal) the threshold voltage distribution S2 is an optimal read voltage that is referred to as a first optimal read voltage ORV1 in the method of operating a flash memory of FIG. 1.

In the method of operating a flash memory of FIG. 1, in order to quickly and accurately predict the first optimal read voltage ORV1, it may be possible to detect (e.g., calculate) the difference between the first reference read voltage RRV1 and the first optimal read voltage ORV1 by applying a first adjustment parameter α1 to the difference of the number of memory cells included in a first threshold voltage range A and a second threshold voltage range B formed based on the already-known read voltage (the first reference read voltage RRV1). For example, the first reference read voltage RRV1 may be a read voltage which is set to identify the initial setting state of the first threshold voltage range A and the second threshold voltage range B before the counting step (S120) of FIG. 1. For example, as illustrated in FIG. 3, the first reference read voltage RRV1 may be the initial read voltage that is set to distinguish between the initially separated ranges of the first threshold voltage range A in initial distribution ini_S1 and the second threshold voltage range B in initial distribution ini_S2.

The first threshold voltage range A and the second threshold voltage range B are defined by the first reference read voltage RRV1 and by a pair of first and second search read voltages SRV11 and SRV12. As illustrated in FIG. 3, the first reference read voltage RRV1 may be an initial read voltage IRV for identifying (distinguishing between) initial states ini_S1 and ini_S2 of the adjacent threshold voltage distributions. As described above, as the environment of the flash memory changes, the threshold voltage distributions may also change from the initial state ini_S1 and the initial state ini_S2 of FIG. 3 to the threshold voltage distributions S1 and S2 of FIG. 2; and the initial read voltage IRV may have a voltage level between initial threshold voltage distributions of the initial states ini_S1 and ini_S2 to identify (distinguish between) initially-set threshold voltage distributions at the initial states ini_S1 and ini_S2 of FIG. 3.

Figure 4A:
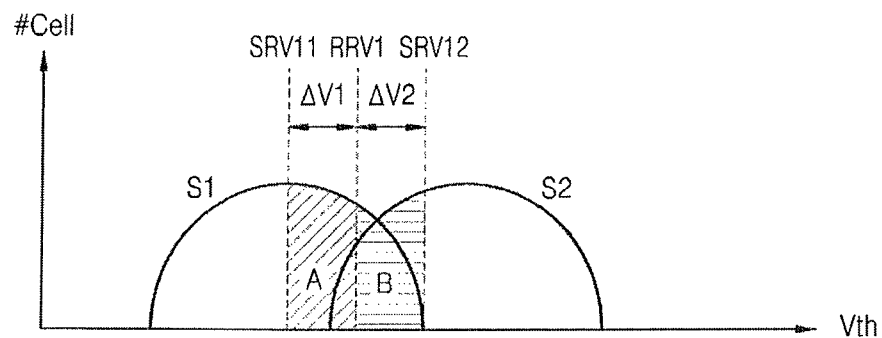
FIGS. 4A, 4B, and 4C are threshold voltage distribution diagram illustrating various examples of a first voltage difference and a second voltage difference of FIG. 1.
Figure 4B:
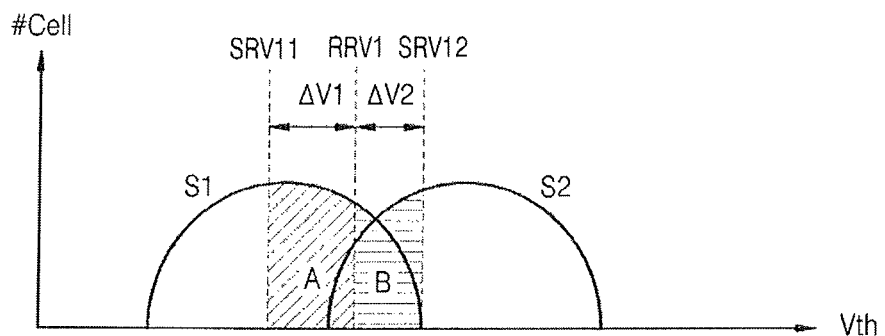
Figure 4C:
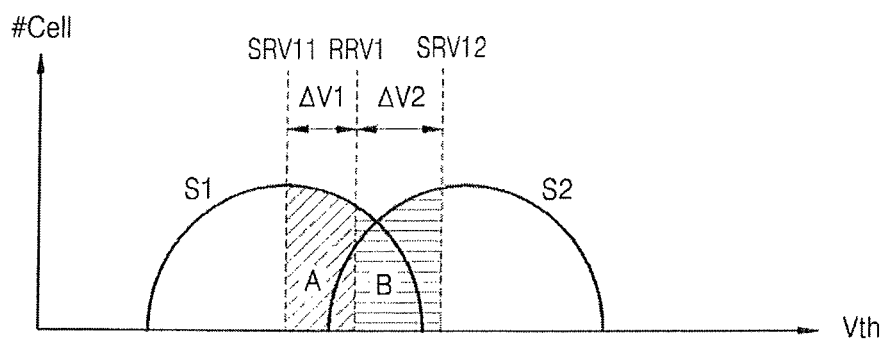

Referring to FIGS. 1 and 2 again, first and second search read voltages SRV11 and SRV12 respectively have first and second voltage differences ΔV1 with respect to the first reference read voltage RRV1. For example, the first search read voltage SRV11 may be set to a voltage level smaller than the first reference read voltage RRV1 by a difference equal to the first voltage difference ΔV1, and the second search read voltage SRV12 may be set to a voltage level greater than the first reference read voltage RRV1 by a difference equal to the second voltage difference ΔV2. The first voltage difference ΔV1 and the second voltage difference ΔV2 may be equal to each other as illustrated in FIG. 4A, but the embodiment is not limited thereto. Thus, the first voltage difference ΔV1 may be greater than the second voltage difference ΔV2, as illustrated in FIG. 4B, or the first voltage difference ΔV1 may be less than the second voltage difference ΔV2, as illustrated in FIG. 4C.

Figure 5:
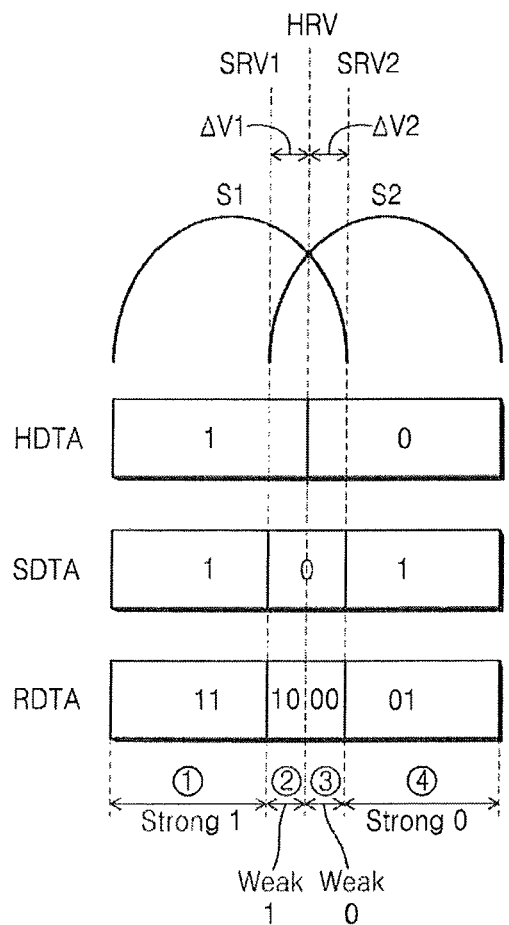
FIG. 5 is a threshold voltage distribution diagram paired with a logical state table illustrating an example of a pair of first and second search read voltages of FIG. 1.

The pair of first and second search read voltages SRV11 and SRV12 of FIG. 2 may be a pair of soft read voltages, namely, first and second soft read voltages SRV1 and SRV2, used at the time of a soft decision operation illustrated in FIG. 5. In the soft decision operation, a hard read voltage HRV is first applied to a random address of a random page of a flash memory so as to identify whether the threshold voltage of each memory cell of the page is larger than the hard read voltage HRV. A memory cell having a threshold voltage less than the hard read voltage HRV may be identified as 1, and a memory cell having a threshold voltage less than the hard read voltage HRV may be identified as 0.

The hard read voltage HRV may have a voltage level that is the same as that of the first reference read voltage RRV1 of FIG. 2. However, the voltage level at a point where the first threshold voltage distribution S1 crosses the second threshold voltage distribution S2 (e.g., the voltage where the probability of memory cells of either state being at the threshold voltage is equal) is illustrated in FIG. 5 for the convenience of explanation of the soft decision operation. The data identified by the hard read voltage HRV may be referred to as hard data HDTA.

Next, the soft decision operation may sense soft data SDTA by sequentially applying the hard read voltage HRV and the first and second soft read voltages SRV1 and SRV2 respectively having first and second voltage differences ΔV1 and ΔV2 from the hard read voltage HRV to the same address to which the hard read voltage HRV was applied. As described above, the first and second soft read voltages SRV1 and SRV2 may respectively be the first and second search read voltages SRV11 and SRV12 of FIG. 2.

A memory cell having a threshold voltage that is lower than the first soft read voltage SRV1 is identified as 1, and a memory cell having a threshold voltage that is higher than the first soft read voltage SRV1 and lower than the second soft read voltage SRV2 is identified as 0. Furthermore, a memory cell having a threshold voltage higher than the second soft read voltage SRV2 is identified as 1.

The soft data SDTA may be obtained by exclusive-OR (XOR) of the bit value of the ON-OFF of the memory cell according to the first soft read voltage SRV1 and the inverted value of the bit value of ON-OFF of the memory cell according to the second soft-read voltage SRV2.

In the example of FIG. 5, in a flash memory or in a memory system including the flash memory, reliability data RDATA that respectively is 11, 10, 00, and 01 is generated for sections ①, ②, ③ and ④ based on hard data HDTA and soft data SDTA. However, the embodiment is not limited thereto, and the reliability data RDATA for each section may have a different value. For example, in a flash memory or a memory system including the flash memory, the data (bit), which is read from the memory cell having a threshold voltage included in section ① where reliability data RDATA is identified as 11, may be processed as 'strong 1' (indicating that the data (bit) value is identified as 1 and the probability that the value is 1 is high). Thus, a weight referred to as 'strong 1' may be applied to data (bit) read from the memory cell having a threshold voltage included in section ① where reliability data RDATA is identified as 11. Furthermore, data (bit), which is read from the memory cell having a threshold voltage included in section ② where reliability data RDATA is identified as 10, may be processed as 'weak 1' (indicating that the data (bit) value is identified as 1 and the probability that the value is 1 is lower). A weight referred to as 'weak 1' may be applied to data that is read from the memory cell having a threshold voltage included in section ② where reliability data RDATA is identified as 10.

Likewise, a weight referred to as 'strong 0' (indicating that the data (bit) value is identified as 0 and the probability that the value is 0 is high) is applied to data (bit) that is read from the memory cell having a threshold voltage included in section ④ where reliability data RDATA is identified as 01. And a weight referred to as 'weak 0' (indicating that the data (bit) value is identified as 0 and the probability that the value is 0 is low) may be applied to data (bit) that is read from the memory cell having a threshold voltage included in section ③ identified as 00. As such, the weight obtained as a result of the performance of the soft decision may become a criterion for error correction.

Referring to FIGS. 1 and 2 again, in order to acquire the first optimal read voltage ORV1 for the threshold voltage distributions S1 and S2, first, a first reference read voltage RRV1 is applied to the memory cell array of the flash memory, and the number of memory cells having a threshold voltage lower than the first reference read voltage RRV1 is counted. The memory cells having a threshold voltage lower than the first reference read voltage RRV1 may be read as '1s'; and the memory cells having a threshold voltage lower than the first reference read voltage RRV1 may be read as '0s'. Hence, the number of memory cells having a threshold voltage lower than the first reference read voltage RRV1 may be the number of 1s which are applied to the memory cell array of the flash memory and are read.

Next, the number of memory cells having a threshold voltage lower than the first search read voltage SRV11 is counted by applying the first search read voltage SRV11 to the memory cell array of the flash memory. The method of counting the number of memory cells having a threshold voltage lower than the first search read voltage SRV11 may be the same as the method of counting the number of memory cells having a threshold voltage lower than the first reference read voltage RRV1. If the number of memory cells having a threshold voltage lower than the first search read voltage SRV11 is subtracted from the number of memory cells having a threshold voltage lower than the first reference read voltage RRV1, the number of memory cells included in the first threshold voltage range A is counted. Likewise, if the number of memory cells having a threshold voltage lower than the first reference read voltage RRV1 is subtracted from the number of memory cells having a threshold voltage lower than the second search read voltage SRV12, the number of memory cells included in the second threshold voltage range B is counted.

According to the operating method of the flash memory of FIG. 1, the result value $\Delta V$ of applying the first adjustment parameter $\alpha 1$ to the difference between the number n(A) of memory cells included in the first threshold voltage range A and the number n(B) of memory cells included in the second threshold voltage range B may be acquired as shown in the following Equation 1.

$$\Delta V = RRV1 - ORV1 = \alpha 1 (n(B) - n(A))$$ [Equation 1]

The result value $\Delta V$ represents the difference between the first optimal read voltage ORV1 and the first reference read voltage RRV1. Thus, the first optimal read voltage ORV1 may be selected as having a voltage level that differs from the first reference read voltage RRV1 by the result value $\Delta V$. The specific description of the first adjustment parameter $\alpha 1$ will be made later below.

Figure 6:
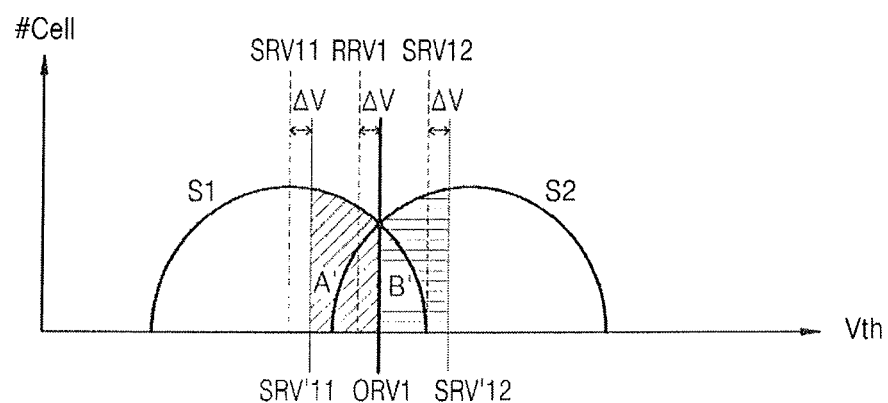
FIG. 6 is a threshold voltage distribution diagram illustrating a first optimal read voltage of FIG. 1.

FIG. 6 is a diagram illustrating the first optimal read voltage ORV1 of FIG. 1.

Referring to FIGS. 1, 2, and 6, the result value $\Delta V$ acquired by Equation 1 is applied to the first reference read voltage RRV1, and the first optimal read voltage ORV1 is set for the adjacently located threshold voltage distribution including the second threshold voltage range B. For example, the first adjustment parameter $\alpha 1$ is a positive real number, and when the number of memory cells included in the second threshold voltage range B of FIG. 2 is less than the number of memory cells included in the first threshold voltage range A, the result value $\Delta V$ may be a negative number. In this case, as illustrated in FIG. 6, the first optimal read voltage ORV1 may have a voltage level higher than the first reference read voltage RRV1 by the result value $\Delta V$.

Likewise, the first threshold voltage range A and the second threshold voltage range B may be respectively changed to a third threshold voltage range A' and a fourth threshold voltage range B' by setting the first optimal read voltage ORV1. The third threshold voltage range A' and the fourth threshold voltage range B' of FIG. 6 may be defined by the first optimal read voltage ORV1 and by a pair of first and second adjustment read voltages SRV'11 and SRV'12. The adjustment read voltages SRV1" and SRV'12 may respectively have a voltage difference with the first and second search read voltages SRV11 and SRV12 of the same result value $\Delta V$. In this example, the range-width of the respective third threshold voltage ranges A' and fourth threshold voltage ranges B' for the adjacently located threshold voltage distributions S1 and S2, which are divided based on the first optimal read voltage ORV1, are the same as the range-width of threshold voltage range A and B.

Likewise, in the method of operating a flash memory of an embodiment, the optimal read voltage for minimizing error occurrence while reading (distinguishing between) the adjacently located threshold voltage distribution may be detected (calculated) by using three read operations. Hence, according to the method of operating a flash memory of an embodiment, the optimal read voltage may be set within a short time, and thus the operation speed of the flash memory and a system including the flash memory may be improved.

Hereinafter, characteristics of the first adjustment parameter $\alpha 1$, which is used in acquiring the optimal read voltage in a method of operating a flash memory of an embodiment, will be described.

FIGS. 7 and 8 are diagrams respectively illustrating the first adjustment parameter $\alpha 1$ of FIG. 1.

Figure 7A:
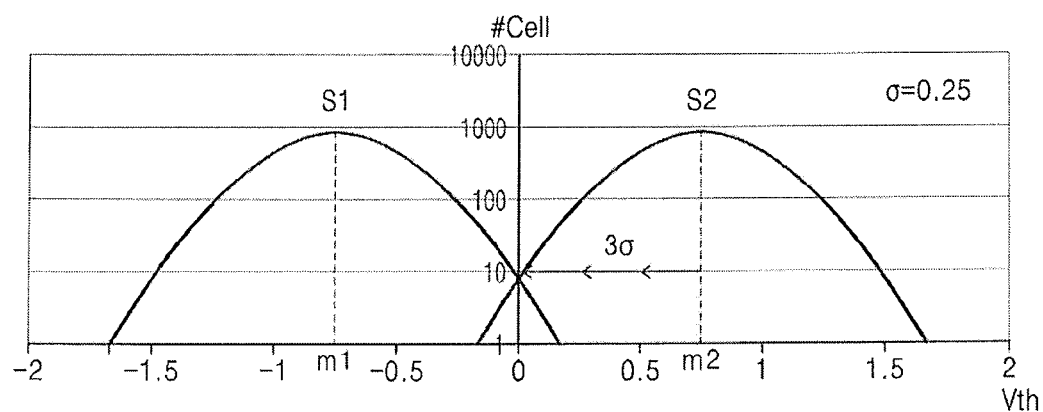
FIGS. 7A and 8A are threshold voltage distribution diagrams respectively illustrating a first adjustment parameter of FIG. 1.

First, referring to FIG. 7(a), the adjacently located threshold voltage distributions S1 and S2 are naturally formed as Gaussian distributions. FIG. 7(a) illustrates that the standard deviation $\sigma$ is 0.25 and the average values (center, m1, and m2) are respectively −0.75 and +0.75. Also, the distance from each average value (center, m1, and m2) to the point (the point where the threshold voltage Vth=0) where the adjacently located threshold voltage distributions S1 and S2 cross (the intersecting curves at such point indicate that the probability of memory cells of either state being at the point's threshold voltage is equal) is three times the standard deviation 6 of the threshold voltage distributions S1 and S2 of FIG. 7(a). Furthermore, FIG. 7(a) shows an example that both the first voltage difference $\Delta V1$ and the second voltage difference $\Delta V2$ are 0.3.

Figure 7B:
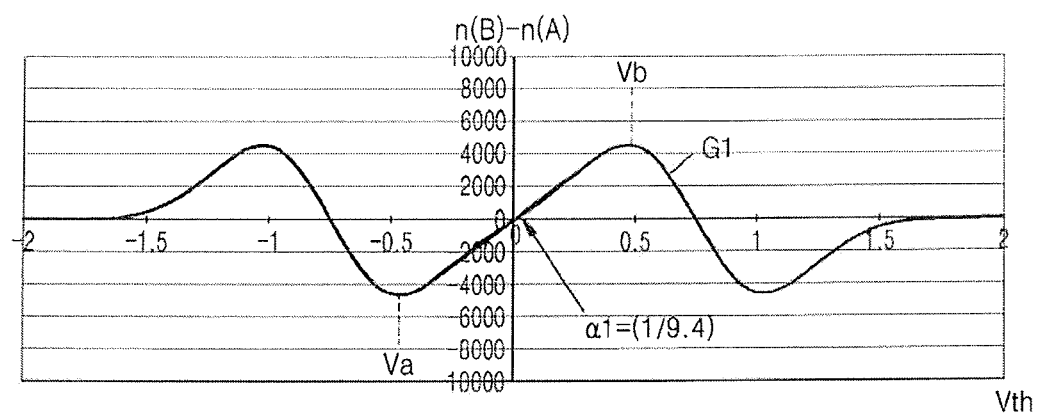
FIGS. 7B and 8B are threshold voltage distribution diagrams respectively illustrating a first adjustment parameter of FIG. 1.

In FIG. 7(b), the number n(A) is the number of memory cells included in the first threshold voltage range A and the number n(B) is the number of memory cells included in the second threshold voltage range B. When the relation between the threshold voltage of the memory cell and the number of memory cells at each threshold voltage has a distribution as shown in FIG. 7(a), the relation of threshold voltage of the memory cells and the difference n(B)−n(A) may be as illustrated the graph G1 of FIG. 7(b). The graph G1 of FIG. 7(b) may be expressed as an arbitrary equation of the third degree. The first adjustment parameter $\alpha 1$ may be a coefficient of the expression of the first degree of an arbitrary equation indicating the graph G1 of FIG. 7(b). In other words, the first adjustment parameter α1 may be equal to the slope of the tangent at the origin of the graph G1 of FIG. 7(b).

The first adjustment parameter α1 is a constant regarding the difference n(B)−n(A) between the number of memory cells n(A) included in the first threshold voltage range A and the number n(B) of memory cells included in the second threshold voltage range B in a range between the first point Va and the second point Vb. The first point Va and the second point Vb are respective points that are closer by the standard deviation σ in a direction where the threshold voltage Vth is 0 from the centers m1 and m2 of adjacently located threshold voltage distributions S1 and S2 of FIG. 7(a). The first threshold voltage range A and the second threshold voltage range B of FIG. 2 may be set to be between the first point Va and the second point Vb. FIG. 7(b) illustrates an example that the first adjustment parameter α1 between the first point Va and the second point Vb is 1/9.4.

Figure 8A:
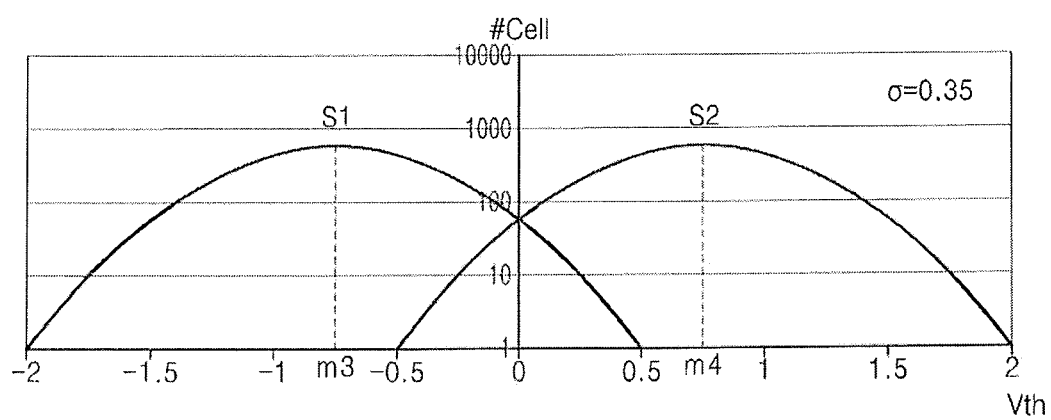

Next, referring to FIG. 8(a), the adjacently located threshold voltage distributions S1 and S2 of FIG. 8 are formed as Gaussian distributions. Each of the adjacently located threshold voltage distributions S1 and S2 have the standard deviation σ. FIG. 8(a) illustrates an example that the standard deviation σ is 0.35. Even though the standard deviations of FIG. 7(a) and FIG. 8(a) differ, the centers m1 and m2 of the adjacently located threshold voltage distributions S1 and S2 of FIG. 7(a) and the centers m3 and m4 of the adjacently located threshold voltage distributions S1 and S2 of FIG. 8(a) may be maintained the same (at +/−0.75) due to the characteristics of a Gaussian distribution.

Figure 8B:
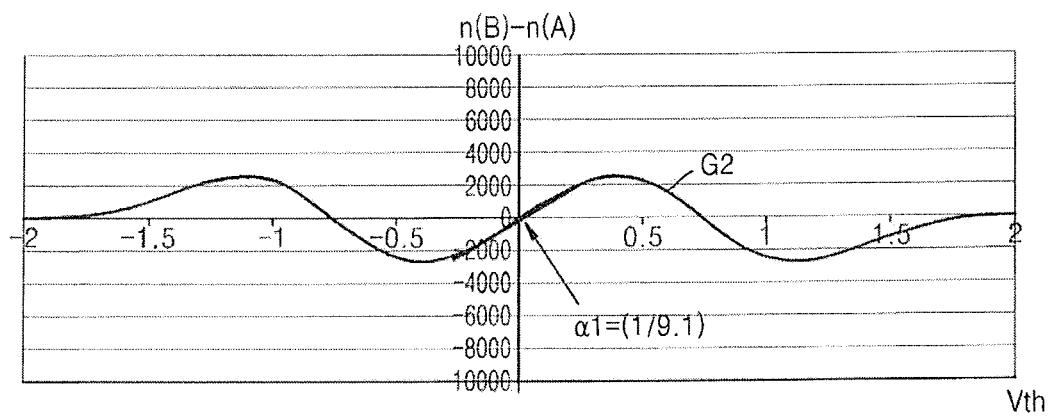

If the relation between the threshold voltage of the memory cell and the number of memory cells thereat has a Gaussian distribution as in FIG. 8(a), then the relation between the threshold voltage of the memory cells and the difference n(B)−n(A) between the number of memory cells n(A) included in the first threshold voltage range A and the number n(B) of memory cells included in the second threshold voltage range B may be as shown in the graph G2 of FIG. 8(b). The adjacently located threshold voltage distributions S1 and S2 of FIG. 8(a) are different from adjacently located threshold voltage distributions S1 and S2 of FIG. 7(a) (i.e., the standard deviation σ is different), and thus the graph G1 of FIG. 7(b) is also different from the graph G2 of FIG. 8(b).

However, the first adjustment parameter α1 between the first point Va and the second point Vb is similar in the graph G1 of FIG. 7(b) and in the graph G2 of FIG. 8(b). For example, in FIG. 7(b), the first adjustment parameter α1 is 1/9.4, and in FIG. 8(b), the first adjustment parameter α1 is 1/9.1. Thus, as illustrated, the first adjustment parameter α1 is not significantly affected by the standard deviation σ of adjacently located threshold voltage distributions S1 and S2.

In other words, the first adjustment parameter α1 according to an embodiment is a constant in a voltage range between the first point Va and the second point Vb including the first threshold voltage range A and the second threshold voltage range B of FIG. 2, and is not significantly dependent on the standard deviation σ. Hence, according to a method of operating a flash memory, according to an embodiment, the first optimal read voltage ORV1 may be set by applying the first adjustment parameter α1 to various from adjacently-located Gaussian threshold voltage distributions.

Two pairs of adjacent Gaussian threshold voltage distributions have been described above, but the present invention is not limited thereto. According to a method of operating a flash memory, according to an exemplary embodiment, a scheme of detecting the optimal read voltage may also be applied to a plurality of Gaussian threshold voltage distributions, as described below.

Figure 9:
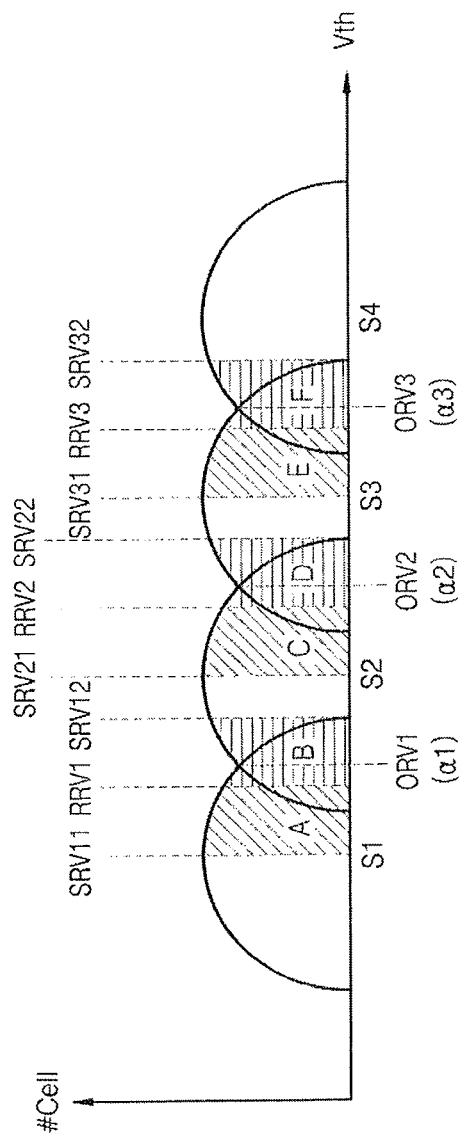
FIG. 9 is a threshold voltage distribution diagram illustrating a method of operating a flash memory, according to an exemplary embodiment.

FIG. 9 is a diagram illustrating a method of operating a flash memory, according to an exemplary embodiment.

Referring to FIG. 9, three or more adjacent threshold voltage distributions may be set for the flash memory, representing two or more bits of data. The flash memory employing such multiple threshold voltage distributions in each memory cell is called a multi-level cell (MLC) flash memory. Hereinafter, a NAND flash memory where data of two or more bits are programmed in the memory cell will be referred to as an MLC NAND flash memory. In the MLC NAND flash memory, in order to distinguish between 4 or more threshold voltage ranges, the reference read voltages may be set to three or more initial voltage levels.

Referring to FIG. 9 again, FIG. 9 illustrates four threshold voltage distributions S1, S2, S3, and S4. The four threshold voltage distributions S1, S2, S3, and S4 may be, for example, the four threshold voltage distributions of a 2-bit MLC flash memory or may be a portion of a set of 8 threshold voltage distributions of a 3-bit MLC flash memory. The reference read voltages for adjacently located threshold voltage distributions S1 and S2, S2 and S3, and S3 and S4 may be respectively the first reference read voltage RRV1, the second reference read voltage RRV2, and the third reference read voltage RRV3. The first reference read voltage RRV1, the second reference read voltage RRV2, and the third reference read voltage RRV3 may be the initial read voltage initially set to identify the four respective threshold voltage distributions S1, S2, S3, and S4. Respective regions A, B, C, D, E, and F included in adjacently located threshold voltage distributions S1 and S2, S2 and S3, and S3 and S4 in FIG. 9 may be defined by each of the first reference read voltage RRV1, the second reference read voltage RRV2, and the third reference read voltage RRV3, and the corresponding search read voltages SRV11, SRV12, SRV21, SRV22, SRV31, and SRV32.

Furthermore, optimal read voltages for the four threshold voltage distributions S1 and S2, S2 and S3, and S3 and S4 may be the first optimal read voltage ORV1, the second optimal read voltage ORV2, and the third optimal read voltage ORV3, respectively. The first optimal read voltage ORV1, the second optimal read voltage ORV2, and the third optimal read voltage ORV3 may be calculated by applying an adjustment parameter corresponding to the difference between the number of memory cells included in two regions to a reference read voltage as described above.

For example, the first optimal read voltage ORV1 may be acquired by applying a first adjustment parameter α1 to the difference between the number of memory cells included in each of regions A and B. And the second optimal read voltage ORV2 may be acquired by applying a second adjustment parameter α2 to the difference between the number of memory cells included in each of regions C and D. And a third optimal read voltage ORV3 may be acquired by applying the third adjustment parameter α3 to the difference between the number of memory cells included in each of regions E and F.

For example, as illustrated in FIG. 10(a), the first adjustment parameter α1, the second adjustment parameter α2, and the third adjustment parameter α3 may be the same. Alternatively, the first adjustment parameter α1, the second adjustment parameter α2, and the third adjustment parameter α3 may be different as illustrated in FIG. 10(b).

Whether the adjustment parameters are different may be determined according to a requirement of a flash memory and a memory system including the flash memory. For example, generally, a change of the threshold voltage distribution in the same flash memories may similarly occur, and when the resources of a flash memory and a memory system including the flash memory are not sufficient, the adjustment parameter is the slope of the tangent at the origin of the graph showing the difference n(B)−n(A) between the number of memory cells for two regions and the threshold voltage Vth, and because the slope of the tangent is not sensitive to the difference of distributions due to the characteristics of a Gaussian distribution, the first adjustment parameter α1, the second adjustment parameter α2, and the third adjustment parameter α3 may be set to be the same to most simply set the adjustment parameter αs in FIG. 10(a). In contrast, when the reliability of a flash memory or a memory system including the flash memory becomes the most important consideration, in order to set a more accurate optimal read voltage, the first adjustment parameter α1, the second adjustment parameter α2, and the third adjustment parameter α3 may be individually set for the respectively adjacently located distributions as in FIG. 10(b).

Figure 11A:
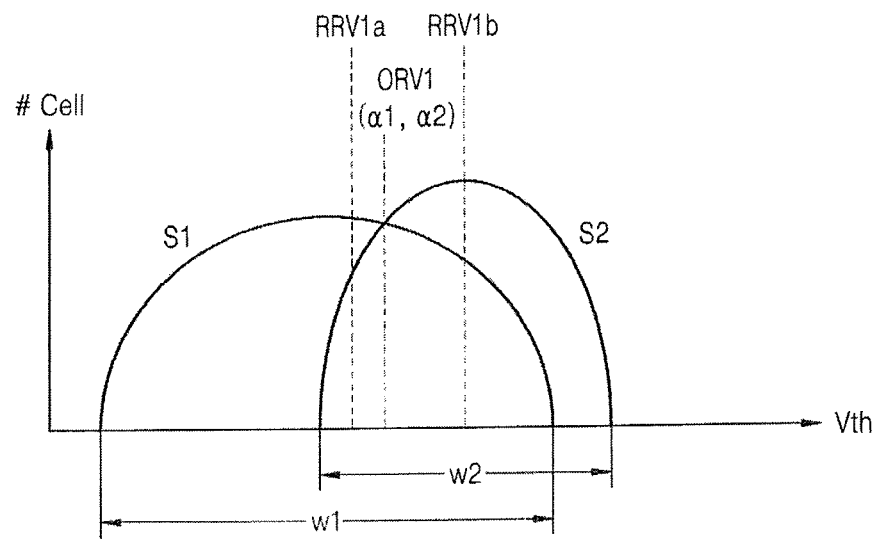
FIGS. 11A and 11B are threshold voltage distribution diagrams illustrating a method of operating a flash memory, according to an exemplary embodiment.
Figure 11B:
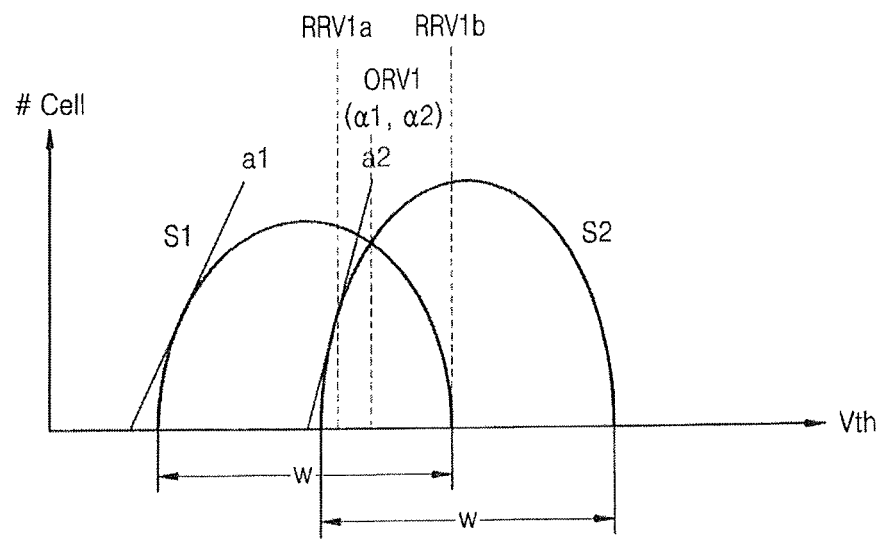

FIGS. 11A and 11B are threshold voltage distribution diagrams illustrating a method of operating a flash memory, according to an exemplary embodiment.

Referring to FIGS. 11A & 11B, a method of operating a flash memory, according to an exemplary embodiment, may be applied when adjacently located threshold voltage distributions S1 and S2 are asymmetric. The adjacently located Gaussian threshold voltage distributions S1 and S2 may be a case where the widths of Gaussian distributions are different (w1≠w2), as illustrated in FIG. 11AA, or the may be a case where the slopes of the Gaussian distributions are different (a1≠a2), as in FIG. 11BB.

When adjacently located threshold voltage distributions S1 and S2 are asymmetric, the adjustment parameter, which is used in detecting the first optimal read voltage ORV1, may be differently set according to the voltage level of the reference read voltage. For example, when the voltage level of the first reference read voltage RRV1a corresponds to the first threshold voltage distribution S1 based on the point where the adjacently located threshold voltage distributions S1 and S2 overlap, the difference n(B)−n(A) between the number of memory cells included in the first threshold voltage range A and the number of memory cells included in second threshold voltage range B may have a negative value, and the corresponding first adjustment parameter α1 may be set. On the other hand, when the voltage level of the first reference read voltage RRV1b corresponds to the second threshold voltage distribution S2 based on the point where the adjacently located threshold voltage distributions S1 and S2 overlap, the difference n(B)−n(A) between the number of memory cells included in the first threshold voltage range A and the number of memory cells included in the second threshold voltage range B of FIG. 2 may have a positive value, and the corresponding second adjustment parameter α2 may be set as a value that is different from the first adjustment parameter α1.

Figure 12A:
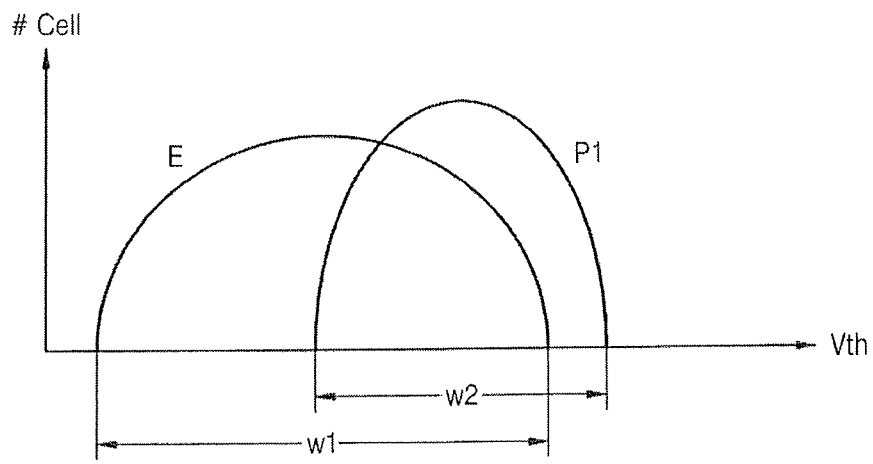
FIGS. 12A, 12B, and 12C are threshold voltage distribution diagrams illustrating a method of operating adjacent threshold voltage distributions of FIG. 11.
Figure 12B:
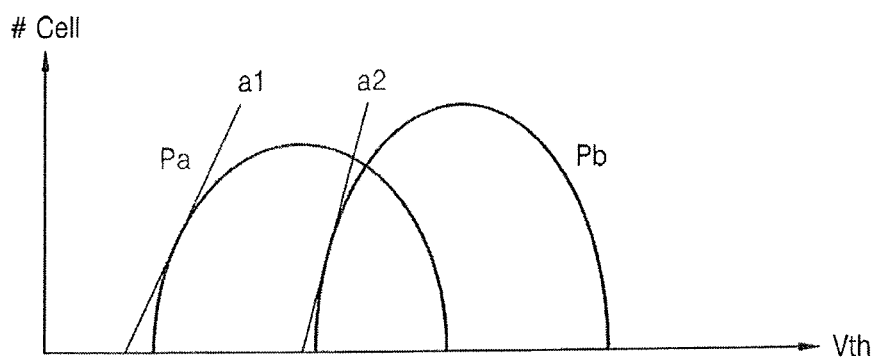
Figure 12C:
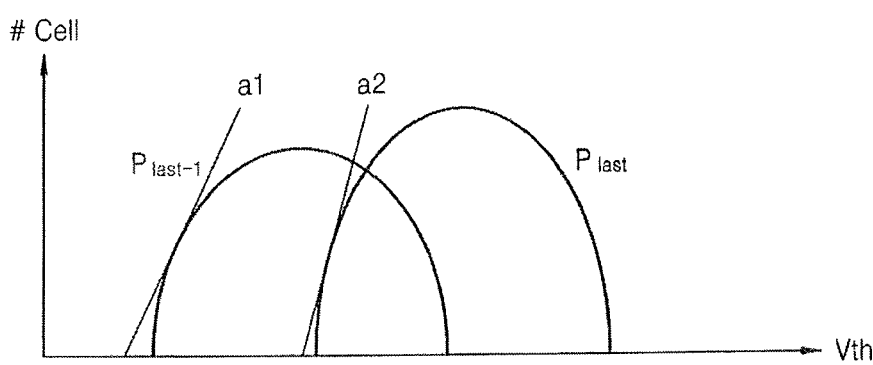

FIGS. 12A, 12B and 12C are threshold voltage distribution diagrams illustrating a method of operating adjacent threshold voltage distributions of FIGS. 11A and 11B.

Referring to FIGS. 11A and 12A, adjacently located first threshold voltage distributions S1 and S2 may represent the erase state E having a different distribution width and the first program state P1, respectively. Also, referring to FIGS. 11B and 12B, adjacently located first threshold voltage distribution S1 and second threshold voltage distribution S2 may respectively represent arbitrary program states Pa and Pb (e.g., erase state E and the first program state P1) having respective slopes of distributions that are different. In particular, referring to FIGS. 11B and 12C, adjacently located first threshold voltage distribution S1 and second threshold voltage S2 may respectively represent a distribution $P_{last}$ having the highest threshold voltage among arbitrary program states having different slopes of distribution, and a distribution $P_{last-1}$ adjacent to the distribution $P_{last}$. For example, in a 2-bit MLC flash memory, the distributions $P_{last-1}$ and $P_{last}$ of FIG. 12C represent the second program state (P2) and the third program state (P3), respectively, and in a 3-bit MLC flash memory, the distributions $P_{last-1}$ and $P_{last}$ of FIG. 12C represent the sixth program state (P6) and the seventh program state (P7), respectively.

Figure 13:
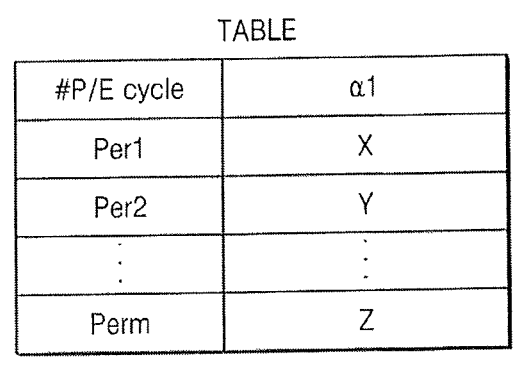

FIG. 13 is a table illustrating a method of operating a flash memory, according to an exemplary embodiment.

Referring to FIGS. 2 and 13, the method of operating a flash memory, according to an exemplary embodiment, sets the first adjustment parameter α1 differently according to the erase count number of memory cells. For example, the first adjustment parameter α1 may be differently set according to the program/erase (P/E) cycle count for the memory cells having the threshold voltage included in adjacently located threshold voltage distributions including the first threshold voltage range A and the second threshold voltage range B. For example, when the P/E cycle count is within the first range Per1, the first adjustment parameter α1 may be set to X, and when the P/E cycle count is the second range Per2, the first adjustment parameter α1 may be set to Y. Likewise, when the P/E cycle count is the mth range Perm, the first adjustment parameter α1 may be set to Z. X, Y, and Z may be different values. As the P/E cycle count increases, the width or slope of the threshold voltage distribution may be changed, and by individually setting the first adjustment parameter α1, the reliability of a flash memory and a memory system including the flash memory may be improved. The first adjustment parameter α1, which is set according to the P/E cycle count, may be stored as a table shown in FIG. 13.

Figure 14:
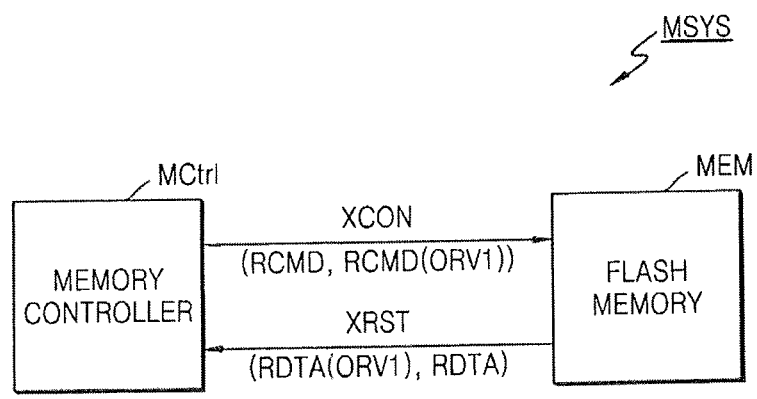
FIG. 14 is a block diagram of a flash memory system according to an exemplary embodiment.

FIG. 14 is a block diagram of a flash memory system as a memory system MSYS according to an exemplary embodiment.

Referring to FIG. 14, the memory system MSYS according to an exemplary embodiment includes a memory controller MCtrl and a flash memory MEM. The flash memory MEM according to an embodiment may be a NAND flash memory. The flash memory MEM receives a control signal XCON from the memory controller MCtrl, and performs an operation corresponding to the control signal XCON. The flash memory MEM transmits the result of the performance of the operation corresponding to the control signal XCON to the memory controller MCtrl. For example, in response to the control signal XCON, the flash memory MEM may perform read, program, or erase operations, or may transmit read data, information regarding whether program has been completed and whether erase has been completed to the memory controller MCtrl.

For example, in response to the control signal XCON indicating the read command RCMD, the flash memory MEM may set the first optimal read voltage ORV1 and transmit the setting information and the read result (data, RDTA(ORV1)) according to the first optimal read voltage ORV1 to the memory controller MCtrl as the execution result XRST. However, information on the first optimal read voltage ORV1 may not be transmitted to the memory controller MCtrl.

For example, in response to the control signal RCMD (ORV1) indicating the read command RCMD including information on the first optima read voltage ORV1, which is set in the above-stated scheme, the flash memory MEM may transmit the read result RDTA for the first optimal read voltage ORV1 to the memory controller MCtrl as the execution result XRST.

Figure 15:
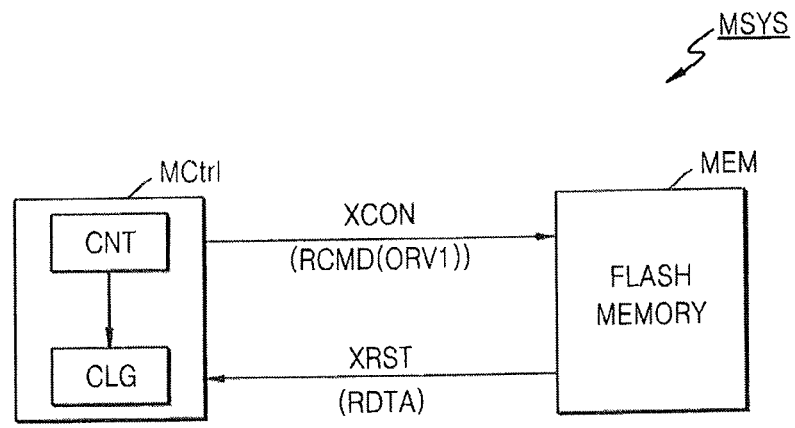
FIGS. 15 and 16 are block diagrams of flash memory systems according to other exemplary embodiments respectively illustrating an example where a counter and a control logic are provided to the memory controller in the flash memory system of FIG. 14.
Figure 16:
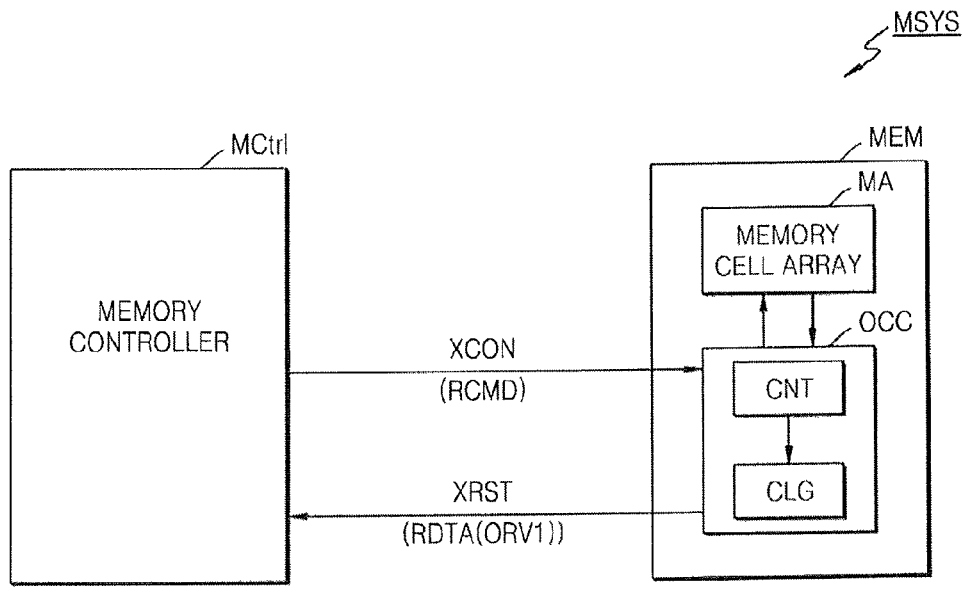

FIGS. 15 and 16 are block diagrams respectively illustrating an example where a counter and a control logic are provided to the memory controller MCtrl in the flash memory system of FIG. 14.

Referring to FIGS. 2 and 15, the memory controller MCtrl of the memory system MSYS according to an embodiment includes a counter CNT and a control logic CLG. The counter CNT respectively counts the number of memory cells included in the first threshold voltage range A and the second threshold voltage range B that are defined by the first reference read voltage RRV1 and the pair of first and second search read voltages SRV11 and SRV12 respectively having a first voltage difference and a second voltage difference with respect to the first reference read voltage RRV1. The control logic CLG calculates a result value, which is generated by applying the first adjustment parameter $\alpha 1$ to the difference between the number of memory cells included in the first threshold voltage range A and the number of memory cells included in the second threshold voltage range B, in the first reference read voltage RRV1, and sets the result of calculation as the first optimal read voltage ORV1 for adjacently located threshold voltage distributions S1 and S2 including the first threshold voltage range A and the second threshold voltage range B. A detailed description of the operation of the counter CNT and the control logic CLG is the same as the other one described above.

In the case of FIG. 15, the first optimal read voltage ORV1 is set by the memory controller MCtrl; and the control signal RCMD (ORV1), which indicates the read command RCMD including information on the first optimal read voltage ORV1, is transmitted to the flash memory MEM. In response thereto, the flash memory MEM of FIG. 15 transmits the read result (data, RDTA(ORV1)) according to the first optimal read voltage ORV1 to the memory controller MCtrl as the execution result XRST.

In contrast, referring to FIGS. 2 and 16, an on-chip controller OCC of the flash memory MEM of the memory system MSYS according to an embodiment includes a counter CNT and a control logic CLG. The counter CNT and the control logic CLG may respectively be the same as the counter CNT and the control logic of FIG. 15. In the case of FIG. 16, in response to the control signal XCON indicating the read command RCMD, the flash memory MEM sets the first optimal read voltage ORV1 and transmits the setting information and the read result (data, RDTA (ORV1)) according to the first optimal read voltage (ORV1) to the memory controller MCtrl as the execution result XRST. However, as described above, information on the first optimal read voltage ORV1 may not be transmitted to the memory controller MCtrl.

In response to the control signal XCON indicating the read command RCMD, the on-chip controller OCC of FIG. 16 may apply the first reference read voltage RRV1 and the pair of first and second search read voltages SRV11 and SRV12 to a memory cell array MA, then count the difference between the number of memory cells included in the first threshold voltage range A and the number of memory cells included in the second threshold voltage range B based on the sensing result thereof, and set the first optimal read voltage ORV1 based on the result value, which is acquired by applying the first adjustment parameter $\alpha 1$.

Figure 17:
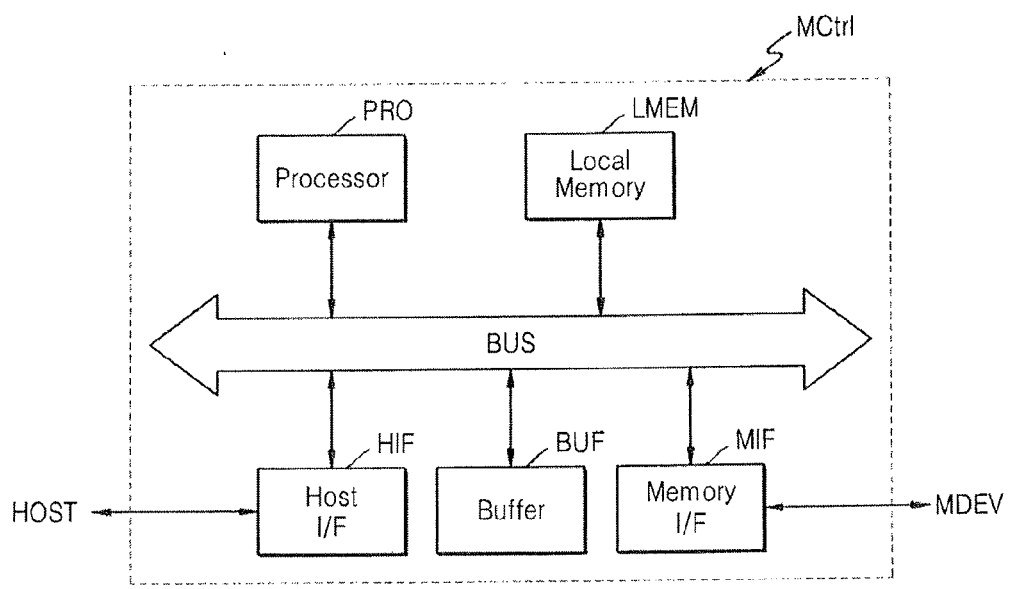
FIG. 17 is a block diagram of an exemplary implementation of the memory controller of the flash memory system of FIG. 14.

FIG. 17 is a block diagram illustrating an example of a memory controller of FIG. 14.

Referring to FIG. 17, the memory controller MCtrl of FIG. 14, a host interface unit HIF, a memory interface unit MIF, a local memory LMEM, a buffer BUF, and a processor PRO are connected via a bus BUS.

The host interface unit HIF provides an interface with an external host device HOST. For example, the host interface unit HIF may provide an interface of serial advance technology attachment (SATA) or serial attached SCSI (SAS) protocol, but the embodiment is not limited thereto. The host interface unit HIF provides an interface with a host device HOST by various interface protocols, such as universal serial bus (USB), man machine communication (MMC), peripheral component interconnect-express (PCI-E), parallel advanced technology attachment (PATA), small computer system interface (SCSI), enhanced small device interface (ESD), and intelligent drive electronics (IDE) in addition to SATA and SAS protocols.

In response to a request from the host device HOST, the memory interface unit MIF provides an interface with the memory device MDEV to program or read data to or from the memory device MDEV. For example, the memory interface unit MIF provides the memory device MDEV with the result that has been converted into a physical address of the page of the memory device MDEV in the logical block address transmitted from the host device HOST.

The buffer BUF may be used for smooth (or asynchronous) data transmission between the host device HOST and the memory device MDEV. For example, the buffer BUF may temporarily store data to be programmed to the memory device MDEV according to the request of the host device HOST. Furthermore, the buffer BUF may temporarily store data, which is read from the memory device MDEV, according to the request of the host device HOST. The buffer BUF may be implemented as a volatile memory, such as DRAM or SRAM, or as a non-volatile memory, such as MRAM, PRAM, FRAM or flash memory.

The local memory LMEM is controlled by the memory controller MCtrl so that the request of the host device HOST may be processed in the memory device MDEV, and data, a control module or a control program may be loaded or stored in the local memory LMEM. For example, firmware may be stored in the local memory LMEM. The firmware is generated when software including commands and data that operate the memory system MSYS is stored in a certain storage unit as hardware, and the firmware performs one or more processes such as machine language processing, data transmission, list processing, floating point operation and channel control for the request of the host device HOST to perform the request of the host device HOST to the memory system MSYS. The firmware may control setting of a normal read command RCMD_N and a soft decision command RCMD_S, and the corresponding read voltage levels.

Furthermore, an operating system and a mapping table referred to in the address mapping, etc. may be stored or loaded in the local memory LMEM. The local memory LMEM may be implemented as a volatile memory, such as DRAM or SRAM, or as a non-volatile memory, such as MRAM, PRAM, FRAM, or a flash memory, as in the buffer BUF. However, the local memory LMEM that forms firmware may be implemented as a non-volatile memory. The local memory LMEM may be implemented as one or more memories of the same type or different types.

The processor PRO processes the request from the host device HOST by controlling operation of each component of the memory controller MCtrl and analyzing and executing a control module or control program stored or loaded in the local memory LMEM.

Figure 18:
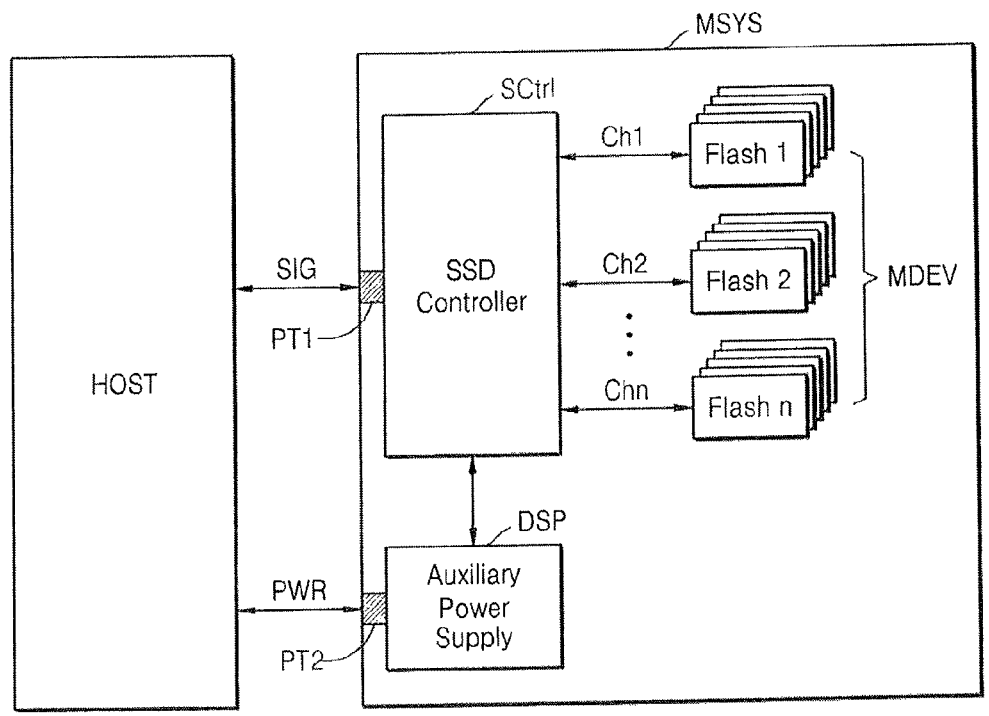
FIG. 18 is a block diagram of an exemplary implementation of the memory system of FIG. 14 applied to implement a solid state drive (SSD)

When the memory system MSYS of FIG. 17 implements a solid state drive (SSD) or is included in a SSD, the memory controller MCtrl of FIG. 14 may be included in the SSD controller SCtrl of FIG. 18.

FIG. 18 is a block diagram illustrating an example where the memory system MSYS of FIG. 14 is applied to implement an SSD.

Referring to FIG. 18, an SSD (MSYS) includes an SSD controller SCtrl and a memory device MDEV. In response to a signal SIG received from a host device HOST through a first port PT1 of the SSD (MSYS), the SSD controller SCtrl controls the memory device MDEV. The SSD controller SCtrl is connected with the memory device MDEV through a plurality of channels Ch1 to CHn. The memory device MDEV includes a plurality of flash memories. A plurality of flash memories may be flash memories according to an embodiment of the present invention. However, the embodiment is not limited thereto, and the flash memories may include other flash memories or other non-volatile memories.

The SSD (MSYS) may include an auxiliary power supply device DSP and may be supplied power PWR through the second port PT2 from the host device HOST. However, the embodiment is not limited thereto, and the SSD (MSYS) may be supplied power from an external device as well as the host device HOST.

The SSD (MSYS) outputs the result SIG, which is acquired by processing the request of the host device HOST, through the first port PT1. The signal SIG, which is output from the SSD (MSYS), may be the above-stated main response MRSP.

Figure 19:
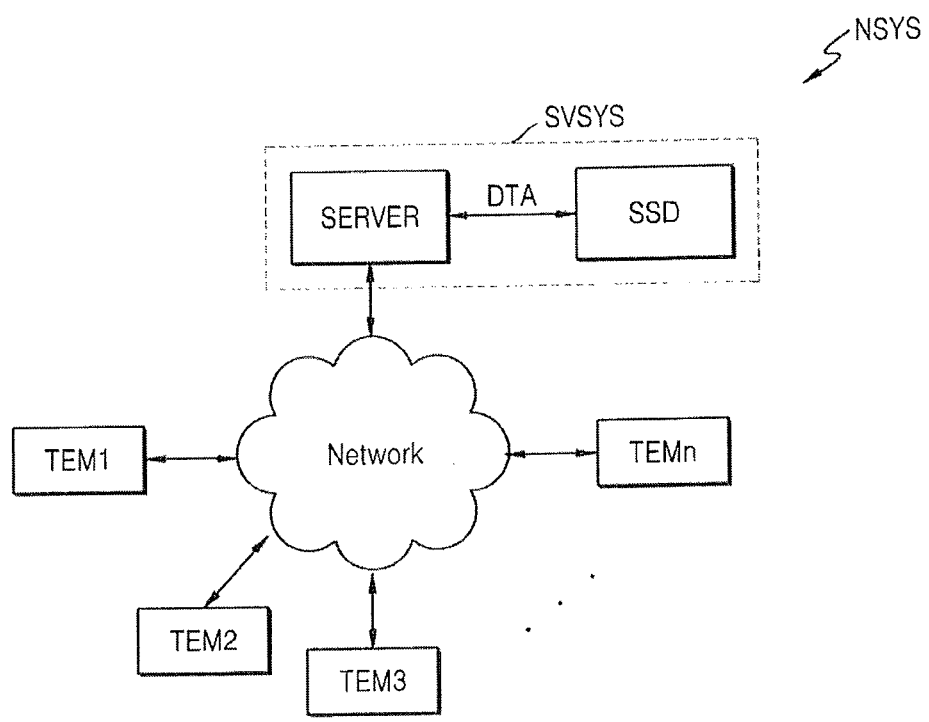
FIG. 19 is a network diagram of an exemplary network system including a server system including the SSD of FIG. 18.

FIG. 19 is a network diagram illustrating a network system including a server system NSYS including the SSD of FIG. 18.

Referring to FIG. 19, the network system NSYS according to an embodiment may include the server system SVSYS and a plurality of terminals TEM1 to TEMn that are connected through a network. The server system SVSYS according to an exemplary embodiment includes a server SERVER that processes a request received from the plurality of terminals TEM1 to TEMn connected to the network, and the SSD that stores data corresponding to a request received from the terminals TEM1 to TEMn.

Figure 20:
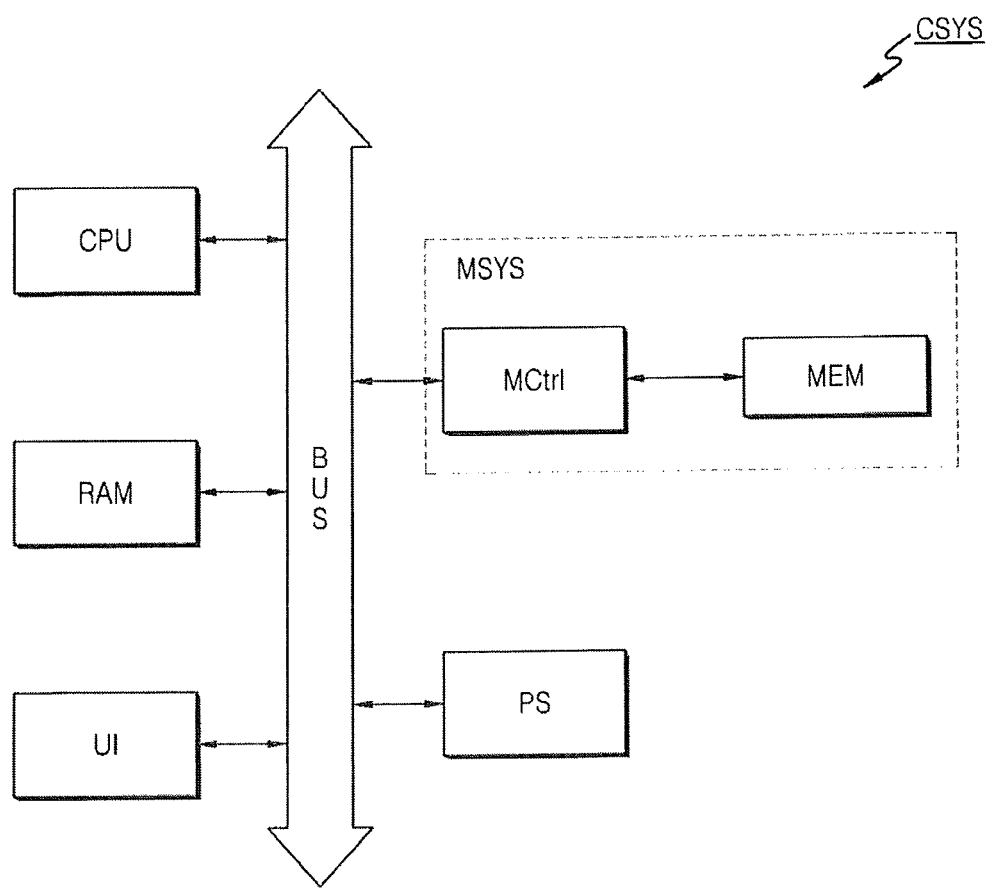
FIG. 20 is a block diagram of a computer device including the memory system of FIG. 14.

FIG. 20 is a block diagram of a computer system CSYS including the memory system MSYS of FIG. 14.

Referring to FIG. 20, the computer system CSYS according to an embodiment includes a processor CPU, a user interface UI, and the memory system MSYS, which are electrically connected to a bus BUS. The computer system CSYS according to an embodiment may further include a power supply device PS. Furthermore, a computer system CSYS according to an embodiment may further include a volatile memory device (e.g., RAM) for transmission and reception of data between the processor CPU and the memory system MSYS.

When the computer system CSYS according to an embodiment is a mobile device, a battery for supplying an operating voltage of a computer system and a modem such as a baseband chipset may be additional provided. Furthermore, those skilled in the art will understand that an application chipset, a camera image processor (CIS), mobile DRAM, etc. may be further provided to the computer system CSYS according to an embodiment of the present invention, and thus the detailed description thereof is omitted here.

Likewise, an exemplary embodiment has been disclosed in the drawings and the specification. The terms used here have been used merely to describe the present invention, but have not been used to limit the scope of the present invention disclosed in the claims.

For example, the flash memory described above may be a two-dimensional NAND flash memory. Alternatively, the above-described flash memory may be a three-dimensionally stacked vertical NAND flash memory as illustrated in FIG. 21.

Figure 21:
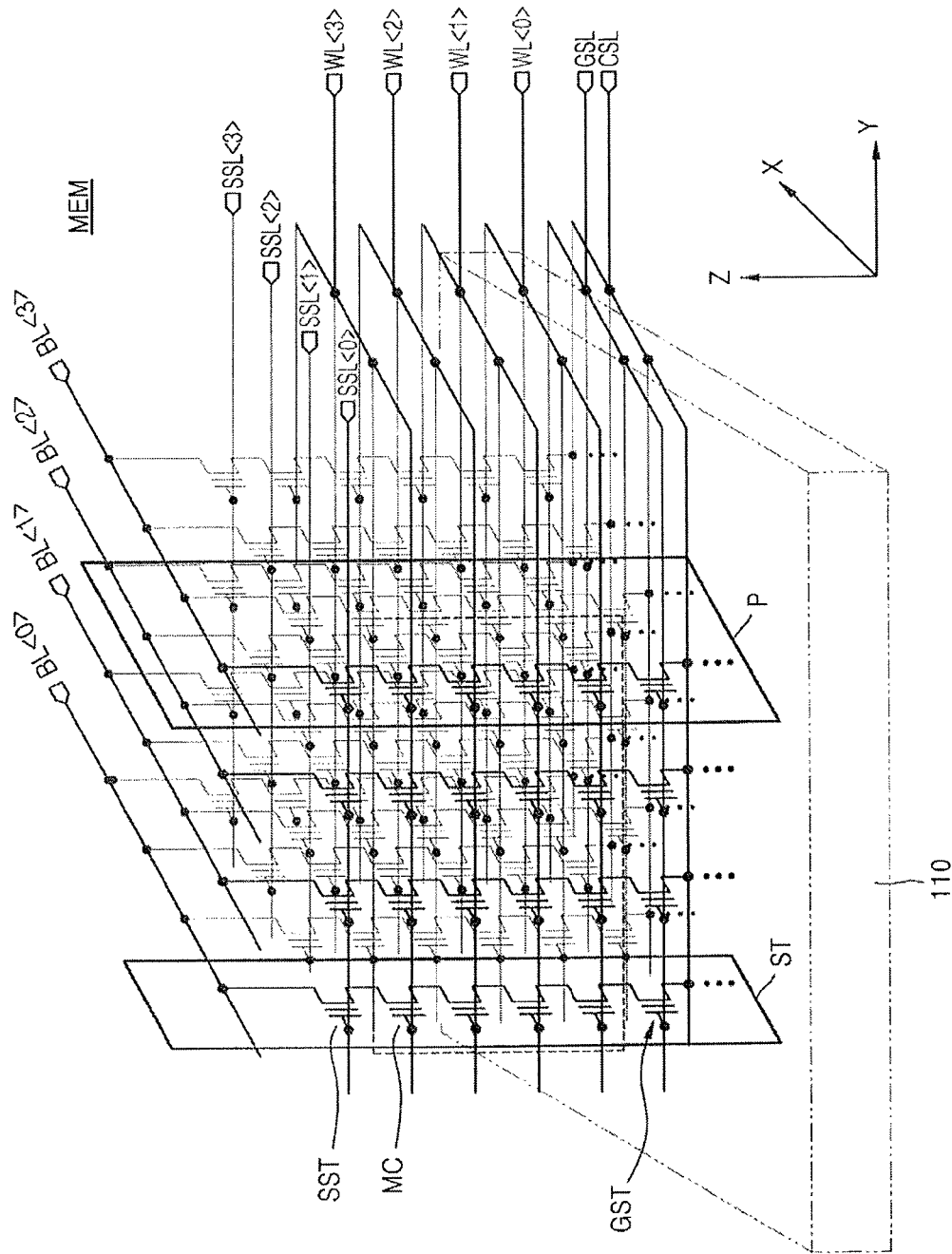
FIG. 21 is a circuit diagram of a three-dimensional exemplary implementation of the flash memory of FIG. 14.

FIG. 21 is a circuit diagram of a three-dimensional exemplary implementation of the flash memory of FIG. 14.

Referring to FIG. 21, the three-dimensional flash memory MEM includes a substrate 110, a plurality of memory cell strings ST, word lines WL<0> to WL<3>, and bit lines BL<0> to BL<3>. The memory cell string ST may be extended in a direction projected from the substrate 110 (e.g., a vertical direction Z). Each memory cell string ST may include memory cells MC, a source selection transistor SST, and a ground selection transistor GST in a z-axis direction. The source selection transistor SST is connected to source selection lines SSL <0> to SSL <3> extended in a row direction Y, and the ground selection transistor GST is connected to ground selection lines GSL extended in a line direction X and a row direction Y. The word lines WL<0> to WL<3> are arranged in a direction Z perpendicular to the substrate 110. Respective word lines WL<0> to WL<3> are located at a part of a layer where respective memory cells MC exist within the memory cell string ST. Respective word lines WL<0> to WL<3> are combined with the memory cells MC arranged as a matrix in the x-axis and y-axis directions on the substrate 110. The bit lines BL<0> to BL<3> are connected with a memory cell string arranged in a line direction X. The memory cells MC within the memory cell string ST, the source selection transistor SST, and the ground selection transistor GST share the same channel. The channel may be formed to extend in a direction Z perpendicular to the substrate 110. For example, the channel may be a channel last structure (e.g., a bit-cost scalable (BiCS) structure) where a gate and an insulation layer structure are formed and then a channel is formed, and may be a channel of a channel-first structure (e.g., a terabit cell array transistor (TCAT) structure) where the channel is first formed (e.g., on a substrate) and thereafter a gate and an insulation layer structure are formed (e.g., on the channel). The number of bit lines and word lines of FIG. 21 is merely an example.

A controller controls the performance of a program operation and/or a verification operation on memory cells MC by applying an appropriate voltage to word lines WL<0> to WL<3> and bit lines BL<0> to <3>. The controller may select a random memory cell string ST by applying a voltage which is set in the source selection lines SSL<0> to SSL<3> connected to the source selection transistor SST and the bit lines BL<0> to BL<3> and may select a random memory cell MC among selected memory cell strings ST by applying a voltage which is set in the word lines WL<0> to WL<3>, and thus the read, programming and/or verification operations for the selected memory cell MC may be performed. The optimal read level may be detected in a short time by using the optimal read voltage which has been described in connection with the three-dimensional flash memory MEM of FIG. 21.

While the inventive concept has been particularly shown and described with reference to exemplary embodiments thereof, it will be understood that various changes in form and details may be made therein without departing from the spirit and scope of the following claims.

What is claimed is:

1. A method of operating a flash memory comprising a plurality of memory cells, the method comprising:
   defining a first adjacent threshold voltage range and a second adjacent threshold voltage range for a first pair of threshold voltage distributions adjacently located;
   counting the number of memory cells having threshold voltages included in the first adjacent threshold voltage range by subtracting the number of the memory cells having a threshold voltage lower than a first search read voltage from a number of the memory cells having a threshold voltage lower than a first reference read voltage;
   counting the number of memory cells included in the second adjacent threshold voltage range by subtracting the number of the memory cells having a threshold voltage lower than the first reference read voltage from the number of the memory cells having a threshold voltage lower than a second search read voltage; and
   setting a first optimal read voltage based on a count difference between the counted number of the memory cells having the threshold voltages included in the first adjacent threshold voltage range and the counted number of the memory cells having the threshold voltages included in the second adjacent threshold voltage range,
   wherein setting the first optimal read voltage based on the count difference, is performed by calculating using a result value generated from applying a first adjustment parameter to the count difference, wherein the first adjustment parameter is a slope of a tangent at the origin of a graph representing the count difference verses a threshold voltage of the memory cells.

2. The method of claim 1, wherein the first adjacent threshold voltage range is defined by the first reference read voltage for discriminating between the first pair of threshold voltage distributions adjacently located and the first search read voltage having a first voltage difference with the first reference read voltage, and the second adjacent threshold voltage range is defined by the first reference read voltage and the second search read voltage having a second voltage difference with the first reference read voltage.

3. The method of claim 2, wherein the first optimal read voltage has a voltage level that is shifted from the first reference read voltage by the result value.

4. The method of claim 2, wherein the first pair of the threshold voltage distributions has the form of a Gaussian distribution, and the first adjustment parameter is independent of the standard deviation of the adjacently located threshold voltage distribution.

5. The method of claim 2, further comprising:
   counting the number of memory cells having threshold voltages included in a third threshold voltage range defined by the second reference read voltage for discriminating between a second pair of threshold voltage distributions adjacently located and a third search read voltage having a third voltage difference from the second reference read voltage, and
   counting the number of memory cells having threshold voltages included in a fourth threshold voltage range defined by the second reference read voltage and a fourth search read voltages having a fourth voltage difference from the second reference read voltage; and
   setting a second optimal read voltage based on a result value generated by applying a second adjustment parameter to a count difference between the number of memory cells having threshold voltages included in the third threshold voltage range and the number of memory cells having threshold voltages included in the fourth threshold voltage range.

6. The method of claim 5, wherein the first adjustment parameter and the one second adjustment parameter are the same.

7. The method of claim 5, wherein the first adjustment parameter is different from the second adjustment parameter.

8. The method of claim 2, further comprises setting the first reference read voltage based on initial states of the first pair of the threshold voltage distributions before the counting the number of memory cells having threshold voltages included in the first adjacent threshold voltage range and the number of memory cells having threshold voltages included in the second adjacent threshold voltage range.

9. The method of claim 2, wherein the first search read voltage and the second search read voltage are a pair of soft read voltages for the first pair of the threshold voltage distributions.

10. The method of claim 1, wherein the first pair of the threshold voltage distributions include two different program states.

11. The method of claim 1, wherein the first pair of the threshold voltage distributions include an erasing state and a first program state.

12. The method of claim 1, wherein the first pair of the threshold voltage distributions include the program state having a highest threshold voltage among threshold voltage distributions which are set for the flash memory.

13. The method of claim 1, wherein the memory cells are arranged vertically from a substrate.

14. A method of operating a flash memory comprising a plurality of memory cells, comprising:
   respectively counting the number of memory cells having threshold voltages included in a first adjacent threshold voltage range and a second adjacent voltage range defined by a first reference read voltage and a pair of first search read voltages having a first voltage difference and a second voltage difference from the first reference read voltage, respectively; and
   setting a first optimal read voltage based on a result value generated by applying an first adjustment parameter to the difference between the number of memory cells having threshold voltages within the first adjacent threshold voltage range and the number of memory cells having threshold voltages within the second adjacent threshold voltage range,
   wherein the memory cells are multi-level cells arranged vertically from a substrate,
   wherein the first adjustment parameter is a slope of a tangent at the origin of a graph representing the difference verses a threshold voltage of the memory cells.

15. A memory device comprising:
   a memory cell array including a plurality of memory cells; and
   an on-chip controller configured to set a first optimal read voltage for the memory cell array in response to an external control signal, the on-chip controller comprising:
   a counter configured to count the number of memory cells included, respectively, in a first adjacent threshold voltage range and a second adjacent threshold voltage range, defined by a first reference read voltage and by a pair of first search read voltages respectively having a first voltage difference and a second voltage difference from the first reference read voltage; and a control logic configured to set the first optimal read voltage based on a result value generated by applying a first adjustment parameter to a difference between the number of memory cells having threshold voltages included within the first adjacent threshold voltage range and the number of memory cells having threshold voltages included within the second adjacent threshold voltage range, wherein the first adjustment parameter is a slope of a tangent at the origin of a graph representing the difference verses a threshold voltage of the memory cells.

16. The memory device of claim 15, wherein the memory cell array comprises a plurality of strings, each string comprising the plurality of memory cells stacked in a vertical direction to a substrate.

17. The memory device of claim 15, wherein the first adjustment parameter is a constant regarding the difference between the number of memory cells having the threshold voltages included in the first adjacent threshold voltage range and the second adjacent threshold voltage range, and is independent of the standard deviation of the first and second threshold voltage distributions which includes the first adjacent threshold voltage range and the second adjacent threshold voltage range and are formed as Gaussian distributions.

18. The memory device of claim 15, wherein the first optimal read voltage has a voltage level that is shifted from the first reference read voltage by the result value.

19. The memory device of claim 15, wherein the first adjustment parameter is set differently according to the counted number of erasures of the memory cells having the threshold voltages within the first pair of the threshold voltage distributions.

* * * * *